US010373726B2

(12) United States Patent
Zhu

(10) Patent No.: US 10,373,726 B2
(45) Date of Patent: Aug. 6, 2019

(54) HIGHLY FILLED BACK SURFACE FIELD ALUMINUM PASTE FOR POINT CONTACTS IN PERC CELLS AND PREPARATION METHOD THEREOF

(71) Applicant: NANTONG T-SUN NEW ENERGY CO., LTD., Nantong, Jiangsu (CN)

(72) Inventor: Peng Zhu, Jiangsu (CN)

(73) Assignee: NANTONG T-SUN NEW ENERGY CO., LTD., Nantong, Jiangsu (CN)

( * ) Notice: Subject to any disclaimer, the term of this patent is extended or adjusted under 35 U.S.C. 154(b) by 92 days.

(21) Appl. No.: 15/571,430

(22) PCT Filed: Apr. 13, 2017

(86) PCT No.: PCT/CN2017/080413
§ 371 (c)(1),
(2) Date: Nov. 2, 2017

(87) PCT Pub. No.: WO2018/040569
PCT Pub. Date: Mar. 8, 2018

(65) Prior Publication Data
US 2019/0156966 A1 May 23, 2019

(30) Foreign Application Priority Data
Aug. 30, 2016 (CN) .......................... 2016 1 0762802

(51) Int. Cl.
*H01B 1/22* (2006.01)
*H01B 13/00* (2006.01)
*H01L 31/0224* (2006.01)
*H01L 31/18* (2006.01)

(52) U.S. Cl.
CPC ............... *H01B 1/22* (2013.01); *H01B 13/00* (2013.01); *H01L 31/0224* (2013.01); *H01L 31/022458* (2013.01); *H01L 31/18* (2013.01)

(58) Field of Classification Search
CPC ............. H01B 1/22; H01B 1/16; H01G 9/055
USPC .......................................... 252/182.1; 438/98
See application file for complete search history.

(56) References Cited

U.S. PATENT DOCUMENTS

2012/0058880 A1 3/2012 Shelestak
2013/0040422 A1* 2/2013 Merchant ................. H01B 1/16 438/98
2015/0371782 A1* 12/2015 Taira ...................... H01G 9/055 252/182.1
2016/0240706 A1 8/2016 Prince et al.

FOREIGN PATENT DOCUMENTS

CN 101345263 A 1/2009
CN 101425545 A 5/2009
CN 101728439 A 6/2010
CN 102097154 A 6/2011
CN 103065701 4/2013
CN 103545013 A 1/2014
CN 105448382 A 3/2016
WO WO 2015-025799 A1 * 2/2015 ............... H01B 1/22

OTHER PUBLICATIONS

International Search Report and Written Opinion of PCT/CN2017/080413 dated Apr. 13, 2017 (Chinese).

* cited by examiner

*Primary Examiner* — Khanh T Nguyen
(74) *Attorney, Agent, or Firm* — Rankin, Hill & Clark LLP

(57) ABSTRACT

A highly filled back surface field aluminum paste for point contacts in PERC cells and its preparation method include dissolving ethyl cellulose in organic solvent, stirring under a certain temperature to prepare a homogeneous and transparent organic carrier, adding aluminum powder, nanosized aluminum-boron-antimony alloy powder and auxiliary additive, and three-roller grinding, comprising 70-85 parts by weight of aluminum powder, 1-5 parts by weight of nanosized aluminum-boron-antimony alloy powder, 10-25 parts by weight of organic carrier, 0.1-6 parts by weight of inorganic binder and 0.01-1 part by weight of auxiliary additive.

8 Claims, No Drawings

HIGHLY FILLED BACK SURFACE FIELD ALUMINUM PASTE FOR POINT CONTACTS IN PERC CELLS AND PREPARATION METHOD THEREOF

FIELD OF THE INVENTION

The invention relates to crystalline silicon solar cells, and more particularly, to a highly filled back surface field aluminum paste for point contacts in PERC Cells and its preparation method.

BACKGROUND OF THE INVENTION

PERC (Passivated Emitter Rear Contact) silicon solar cells are a special type of conventional crystalline silicon solar cells, characterized in that medium passivation layers exist both on the front surface and on the back surface of a solar cell. At present, reducing the cost of crystalline silicon is one of the goals of the photovoltaic industry full of increasingly fierce competition. Generally, making silicon wafers thinner is a development direction for silicon raw material cost reduction. Application of thinner silicon wafers is one of the trends in the future development of crystalline silicon solar cells. When the minority carrier diffusion length is larger than the silicon wafer thickness, the influence of the recombination rate on the back and front surfaces of the cell wafer on the photovoltaic conversion efficiency becomes more important. Improving the quality of surface passivation and decreasing the recombination rate have become the main methods to improve the efficiency of solar cells. To fabricate PERC cells, laser technology is used to notch on the back surface medium layer, so as to bare filiform or punctiform silicon substrates. The passivation film not only has an antireflection effect and increases the red light response, but also reduce the charge carrier recombination at the back surface. The photoelectric conversion efficiency of the solar cells with passivation films can improved 1.0-1.5%. Therefore, the back surface passivation structure is generally used in commercial crystalline silicon solar cells.

Based on the advantages of PERC cells, point contact aluminum back field structure has been paid more and more attention by global solar cell manufacturers, and its industrialization trend has become obvious. Compared with aluminum pastes for conventional aluminum back surface field cells ('conventional aluminum pastes' for short), the aluminum pastes for point contact aluminum back field cells meet higher technical requirements. Conventional aluminum pastes cannot fill well the filiform or punctiform areas exposed in passivation film, cannot form good ohmic contact with silicon substrate after being sintered. Moreover, conventional aluminum pastes have a very strong erosion against the passivation film, which may cause serious damage to the back surface field passivation film. Therefore, it is necessary to develop an aluminum paste suitable for the point contact aluminum back surface field structures. However, during the laboratory research and development processes, it was found that a large number of cavities occurred in the area of the point contact aluminum back surface field after being sintered. These cavities hinder the formation of P+ layer in the aluminum back surface field, deteriorate the ohmic contact, and thus affect the performance of solar cells.

In order to solve the poor filling capacity of point contact back surface field aluminum pastes, and to reduce or eliminate these cavities, the invention provides a method by adding a nanosized aluminum-boron-antimony alloy powder which has a high activity. The existence of boron and antimony in the nanosized aluminum-boron-antimony alloy powder makes the glass powder has good wettability, and at the same time, makes the sintering window adjustable; Tetrabutyl titanate and zinc methacrylate are added simultaneously with nanosized aluminum boron antimony alloy powder. The softening point of glass powders is controlled by compounding of the raw materials. The addition of tetrabutyl titanate and zinc methacrylate makes the thermal stability of glass powders increase, makes the omhic contact become better, and effectively improve the fillibility at the point contact back surface field by the aluminum paste. The filling ratio is more than 90% with the use of the aluminum paste in the invention.

A method which can effectively eliminate the cavities in point contact aluminum back surface field in PERC silicon solar cells is disclosed in Chinese Patent CN 103219416A. A double deposition method is used. Firstly, an aluminum layer is deposited on the areas without back surface passivation film in a crystalline silicon solar cell, and aluminum back surface field is formed after being sintering. Secondly, an aluminum layer is deposited on the partial or entire back surface, and then a back surface metal electrode is formed under low temperature. However, this method is too complicated to apply to the existing production processes.

A special aluminum paste for point contact aluminum back field crystalline silicon solar cells is disclosed in Chines Patent CN 103545013A. Compared with conventional aluminum pastes, the invented aluminum paste has the advantages of good flowability, little damage to the passivation film, good compactness and uniformity. But the filling effect of the aluminum paste is not mentioned.

It is known that point contact aluminum back fields of PERC cells are prone to producing cavities. However, there have not been reports by patent documents at home and abroad on improving the paste filling ratio to more than 90%.

SUMMARY OF THE INVENTION

The object of the invention: the present invention is to provide a highly filled back surface field aluminum paste for point contacts in PERC cells and its preparation method. The aluminum paste is characterized in that it has a relatively little damage to the passivation films, it is capable of forming good ohmic contact in the point contacts in PERC cells, the paste filling ratio is as high as more than 90%, and the electrical performance of solar cells can thus be improved obviously.

Technical Scheme

In order to attain the above object, the invention provide a highly filled back surface field aluminum paste for point contacts in PERC cells, comprising: 70-85 parts by weight of aluminum powder, 1-5 parts by weight of nanosized aluminum-boron-antimony alloy powder, 10-25 parts by weight of organic carrier, 0.1-6 parts by weight of inorganic binder and 0.01-1 part by weight of auxiliary additive.

Preferably, the aluminum powder is a spherical aluminum powder with an oxygen content of 0.3-0.8% and a particle size D50 of 13-17 μm.

Preferably, the nanosized aluminum-boron-antimony alloy powder is prepared by a sol-gel method; Aluminum alkoxide, boron chloride and antimony acetylacetonate are used the raw materials, the proportion of the three raw materials is equimolar for the preparation of the nanosized aluminum-boron-antimony alloy powder, and the particle size is within 20-80 nm.

Preferably, the organic carrier is the mixture of ethyl cellulose and organic solvent; the organic solvent is one or two members of the group consisting of terpineol, diethylene glycol monobutyl ether, ethylene glycol monomethyl ether, butyl carbitol acetate, sorbitan monostearate and lecithin.

Preferably, the inorganic binder is obtained after being ball milled, and is flaky $Bi_2O_3$—$V_2O_5$—$Sb_2O_3$—$MoO_3$ glass powder with a particle size of 7-11 μm and an adjustable softening temperature in the range of 250-650° C.

Preferably, the aluminum paste includes at least one auxiliary additive selected from the group consisting of tetrabutyl titanate and zinc methacrylate.

A preparation method of the highly filled back surface field aluminum paste for point contacts in PERC cells disclosed in the invention includes the following steps:

70-85 parts by weight of aluminum powder, 1-5 parts by weight of nanosized aluminum-boron-antimony alloy powder, 10-25 parts by weight of organic carrier, 0.1-6 parts by weight of inorganic binder and 0.01-1 part by weight of auxiliary additive are weighed, mixed, dispersed with a dispersion machine at a speed of 500-2000 rpm for 1 h, grinded with a three-roller grinding machine to a fineness less than 15 μm, and viscosity of the paste is controlled within 30-50 Pa·s, which is measured with a Brookfield DV2T viscometer at 25° C.

The aluminum paste obtained as above can be used in PERC cells. By the use of the aluminum paste, a uniform and dense back surface field layer can be obtained, and the filling ratio at point contacts is 90% or more. The filling ratio at point contacts is detected by scanning electron microscope (SEM) and metallographic microscope.

The solar cell sample used for testing the filling ratio at point contacts is made by laser dicing and acid solution soaking.

Beneficial Effects

The invention discloses a highly filled back surface field aluminum paste for point contacts in solar cells, which has a little damage to the passivation film, forms a uniform and dense back surface field layer, and is capable of forming a good ohmic contact at point contacts. The application of the aluminum paste of the invention on the back surface field point contacts in PERC silicon solar cells results in a paste filling ratio of more than 90%, and at the same time, addition of a special alloy powder and special additives into the aluminum paste of the invention, and little contamination of impurity ions on the silicon wafers, help to overcome the defects of the existing back surface field aluminum pastes for PERC cells, such as formation of cavities, low filling ratio, thin and uneven back surface field layer. As a result, the photoelectric conversion efficiency of solar cells is further improved.

DETAILED DESCRIPTION OF THE PREFERRED EMBODIMENTS

The present invention is described in detail with some embodiments. The protection scope of the invention is not limited to the embodiments as follow.

Embodiment 1

A highly filled back surface field aluminum paste for point contacts in PERC cells comprises 70 parts by weight of aluminum powder, 3 parts by weight of nanosized aluminum-boron-antimony alloy powder, 25 parts by weight of organic carrier, 1.9 parts by weight of inorganic binder and 0.1 part by weight of auxiliary additive.

The aluminum powder with an oxygen content of 0.50-0.55% and a particle size D50 of 15-17 μm and the nanosized aluminum-boron-antimony alloy powder with particle sizes of 20-40 nm are used.

The organic carrier is the mixture of 2 parts by weight of ethyl cellulose, 15 parts by weight of terpineol, 2 parts by weight of ethylene glycol monomethyl ether, 5 parts by weight of butyl carbitol acetate and 1 part by weight of sorbitan monostearate.

The inorganic binder is obtained after being ball milled, and is flaky $Bi_2O_3$—$V_2O_5$—$Sb_2O_3$—$MoO_3$ glass powder with a particle size of 7-11 μm and a softening temperature in the range of 450-500° C.

The term 'softening temperature of glass powder' used in Claims and in Description of the invention refers to the range of softening temperature point of a given amount of glass powder measured under a temperature programming condition of 15 k/min.

The auxiliary additive is zinc methacrylate.

A preparation method of the highly filled back surface field aluminum paste for point contacts in PERC cells includes the following steps:

(1). Preparation of a Nanosized Aluminum-Boron-Antimony Alloy Powder

The nanosized aluminum-boron-antimony alloy powder is made by a sol-gel method: aluminum alkoxide, boron chloride and antimony acetylacetonate in equimolar ratio are dissolved in a hydrochloric acid solution, stirred at a constant speed for 3 h, and further stirred after adjusting the pH to the range of 5-6 till a stable and transparent sol system is formed. The alloy powder is obtained after ageing, centrifugation, ball milling and drying.

(2). Preparation of the Aluminum Paste

Aluminum powder, nanosized aluminum-boron-antimony alloy powders, inorganic binder, organic carrier and auxiliary additive are weighed according to the above proportion, mixed, dispersed with a dispersion machine at a speed of 500-1000 rpm for 1 h, grinded with a three-roller grinding machine to a fineness less than 15 μm, and viscosity of the paste is controlled within 35-40 Pa·s, which is measured with a Brookfield DV2T viscometer at 25° C.

The filling ratio at the point contacts can be detected and analyzed by scanning electron microscope (SEM) and metallographic microscope. Here is a sampling and detection procedure: the aluminum paste of the invention is screen printed on the medium passivation layer, dried, sintered with a sintering peak temperature of 700-800° C. The sintered printed silicon wafer is diced with a laser scribing machine in the direction perpendicular to the groove line, and then the dicing is soaked in an acid solution till bubbles appear on the surface of the silicon wafer, washed by deionized water and dried.

The calculation method of point contact filling ratio is as follows: assuming there are 100 gate lines on the dicing, the 100 gate lines are observed respectively by metallographic microscope, and thus we have:

$$\text{filling ratio}=\text{number of lines full of the paste}/\text{total line number}\times 100\%$$

Embodiment 2

A highly filled back surface field aluminum paste for point contacts in PERC cells comprises 71 parts by weight of aluminum powder, 4 parts by weight of nanosized aluminum-boron-antimony alloy powder, 22 parts by weight of organic carrier, 2.5 parts by weight of inorganic binder and 0.5 part by weight of auxiliary additive.

The aluminum powder with an oxygen content of 0.45-0.50% and a particle size D50 of 13-15 μm and the nanosized aluminum-boron-antimony alloy powder with particle sizes of 60-80 nm are used.

The organic carrier used is the mixture of 2 parts by weight of ethyl cellulose, 15 parts by weight of terpineol, 2 parts by weight of ethylene glycol monomethyl ether, 5 parts by weight of butyl carbitol acetate and 1 part by weight of sorbitan monostearate.

The inorganic binder is obtained after being ball milled, and is flaky $Bi_2O_3$—$V_2O_5$—$Sb_2O_3$—$MoO_3$ glass powder with a particle size of 7-11 μm and a softening temperature in the range of 400-430° C.

The auxiliary additive is tetrabutyl titanate.

The related preparation steps are the same as embodiment 1.

Embodiment 3

A highly filled back surface field aluminum paste for point contacts in PERC cells comprises 70 parts by weight of aluminum powder, 5 parts by weight of nanosized aluminum-boron-antimony alloy powder, 23 parts by weight of organic carrier, 1.8 parts by weight of inorganic binder and 0.2 part by weight of auxiliary additive.

The aluminum powder with an oxygen content of 0.60-0.65% and a particle size D50 of 15-17 μm and the nanosized aluminum-boron-antimony alloy powder with particle sizes of 60-80 nm are used.

The organic carrier is the mixture of 2 parts by weight of ethyl cellulose, 15 parts by weight of terpineol, 2 parts by weight of ethylene glycol monomethyl ether, 5 parts by weight of butyl carbitol acetate, 0.8 part by weight of sorbitan monostearate and 0.2 part by weight of lecithin.

The inorganic binder is obtained after being ball milled, and is flaky $Bi_2O_3$—$V_2O_5$—$Sb_2O_3$—$MoO_3$ glass powder with a particle size of 7-11 μm and a softening temperature in the range of 380-410° C.

The auxiliary additive is tetrabutyl titanate.

The related preparation steps are the same as embodiment 1.

Embodiment 4

A highly filled back surface field aluminum paste for point contacts in PERC cells comprises 75 parts by weight of aluminum powder, 3 parts by weight of nanosized aluminum-boron-antimony alloy powder, 20.5 parts by weight of organic carrier, 1.45 parts by weight of inorganic binder and 0.05 part by weight of auxiliary additive.

The aluminum powder with an oxygen content of 0.50-0.55% and a particle size D50 of 15-17 μm and the nanosized aluminum-boron-antimony alloy powder with particle sizes of 20-40 nm are used.

The organic carrier is the mixture of 2 parts by weight of ethyl cellulose, 15 parts by weight of terpineol, 2 parts by weight of ethylene glycol monomethyl ether, 5 parts by weight of butyl carbitol acetate, 0.8 part by weight of sorbitan monostearate and 0.2 part by weight of lecithin.

The inorganic binder is obtained after being ball milled, and is flaky $Bi_2O_3$—$V_2O_5$—$Sb_2O_3$—$MoO_3$ glass powder with a particle size of 7-11 μm and a softening temperature in the range of 500-550° C.

The auxiliary additive is zinc methacrylate.

The related preparation steps are the same as embodiment 1.

The invention is not limited to the above preferred embodiments. Various other products made with the identical or similar technologies disclosed in the invention by persons skilled in the art who are enlightened from the invention, no matter any modifications or changes in shape or structure, are within the scope of the invention.

I claim:

1. A highly filled back surface field aluminum paste for point contacts in PERC cells, comprising: 70-85 parts by weight of aluminum powder, 1-5 parts by weight of nanosized aluminum-boron-antimony alloy powder, 10-25 parts by weight of organic carrier, 0.1-6 parts by weight of inorganic binders and 0.01-1 part by weight of auxiliary additive.

2. An aluminum paste according to claim 1, wherein the aluminum powder is a spherical aluminum powder with an oxygen content of 0.3-0.8% and a particle size D50 of 13-17 μm.

3. An aluminum paste according to claim 1, wherein the nanosized aluminum-boron-antimony alloy powder is prepared by a sol-gel method; Aluminum alkoxide, boron chloride and antimony acetylacetonate are used as the raw materials, the proportion of the three raw materials is equimolar for the preparation of the nanosized aluminum-boron-antimony alloy powder, and the particle size is within 20-80 nm.

4. An aluminum paste according to claim 1, wherein the organic carrier is the mixture of ethyl cellulose and organic solvent; the organic solvent is one or two members of the group consisting of terpineol, diethylene glycol monobutyl ether, ethylene glycol monomethyl ether, butyl carbitol acetate, sorbitan monostearate and lecithin.

5. An aluminum paste according to claim 1, wherein the inorganic binder is obtained after being ball milled, and is flaky $Bi_2O_3$—$V_2O_5$—$Sb_2O_3$—$MoO_3$ glass powder with a particle size of 7-11 μm and an adjustable softening temperature in the range of 250-650° C.

6. An aluminum paste according to claim 1, wherein the aluminum paste includes at least one auxiliary additive selected from the group consisting of tetrabutyl titanate and zinc methacrylate.

7. A preparation method of the aluminum paste according to claim 1, including the following steps:

70-85 parts by weight of aluminum powder, 1-5 parts by weight of nanosized aluminum-boron-antimony alloy powder, 10-25 parts by weight of organic carrier and 0.1-6 parts by weight of inorganic binder and 0.01-1 parts by weight of auxiliary additive are weighed, mixed, dispersed with a dispersion machine at a speed of 500-2000 rpm for 1 h, grinded with a three-roller grinding machine to a fineness less than 15 μm, and viscosity of the paste is controlled within 30-50 Pa·s, which is measured with a Brookfield DV2T viscometer at 25° C.

8. An application of the aluminum paste according to claim 1 on PERC cells: by the use of the aluminum paste, a uniform and dense back surface field layer is obtained, and the filling ratio at point contacts is 90% or more, the filling ratio at point contacts is analyzed by scanning electron microscope (SEM) and metallographic microscope, and the solar cell sample used for testing the filling ratio at point contacts is made by laser dicing and acid solution soaking.

* * * * *